United States Patent
Mizuno

(10) Patent No.: US 6,455,837 B2
(45) Date of Patent: Sep. 24, 2002

(54) PHOTODETECTOR APPARATUS

(75) Inventor: Seiichiro Mizuno, Hamamatsu (JP)

(73) Assignee: Hamamatsu Photonics K.K., Hamamatsu (JP)

(*) Notice: Subject to any disclaimer, the term of this patent is extended or adjusted under 35 U.S.C. 154(b) by 0 days.

(21) Appl. No.: 09/870,642

(22) Filed: Jun. 1, 2001

Related U.S. Application Data

(63) Continuation-in-part of application No. PCT/JP99/06757, filed on Dec. 2, 1999.

(30) Foreign Application Priority Data

Feb. 12, 1998 (JP) .......................... 10-343103

(51) Int. Cl.⁷ .............................................. H01J 40/14
(52) U.S. Cl. ............................ 250/214 R; 250/214 A
(58) Field of Search ..................... 250/214 R, 214 A, 250/214 LS, 208.1; 330/59, 308; 348/300, 301; 356/221, 222, 226

(56) References Cited

U.S. PATENT DOCUMENTS

| | | | |
|---|---|---|---|
| 4,763,197 A | * | 8/1988 | Masuda ...................... 348/245 |
| 5,448,056 A | | 9/1995 | Tsuruta ................... 250/214 A |

FOREIGN PATENT DOCUMENTS

| | | |
|---|---|---|
| JP | 5-63272 | 3/1993 |
| JP | 8-107317 | 4/1996 |
| JP | 8-330560 | 12/1996 |
| JP | 9-51476 | 2/1997 |
| JP | 9-270961 | 10/1997 |
| JP | 10-4520 | 1/1998 |

OTHER PUBLICATIONS

"A 1.5–V, 10–bit, 14.3–MS/s CMOS Pipeline Analog–to–Digital Converter," Andrew M. Abo and Paul R. Gray, Fellow, IEEE Journal of Solid–State Circuits, vol. 34, No. 5, May 1999.

* cited by examiner

Primary Examiner—Que T. Le
(74) Attorney, Agent, or Firm—Morgan, Lewis & Bockius LLP

(57) ABSTRACT

An integrating circuit for inputting current signals outputted from the anode terminal of a photodiode comprises a 2-input/2-output full differential amplifier $A_0$; capacitors; switches; and an additional capacitor. The capacitor and switch are connected in parallel between the "−" input terminal and "+" output terminal of full differential amplifier. The "−" input terminal of differential amplifier is connected to the anode terminal of photodiode PD. The capacitor and switch are connected in parallel between the "+" input terminal and "−" output terminal of full differential amplifier. The "+" input terminal of full differential amplifier is connected to the additional capacitor having a capacitance substantially equal to the junction capacitance of photodiode.

7 Claims, 7 Drawing Sheets

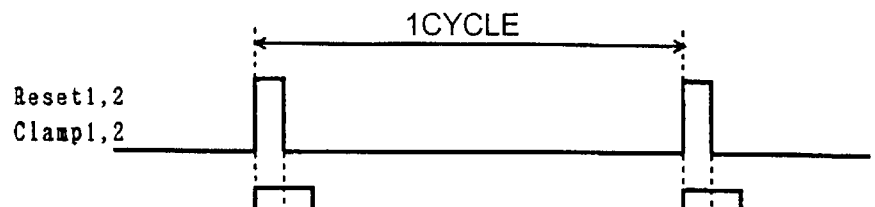
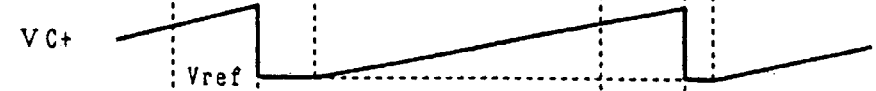
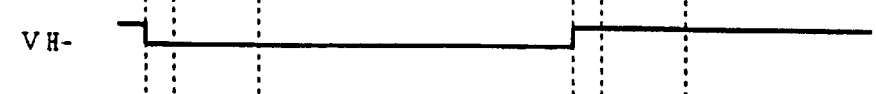

PHOTODETECTOR APPARATUS

RELATED APPLICATION

This is a continuation-in-part application of application Ser. No. PCT/JP99/06757 filed on Dec. 2, 1999, now pending.

BACKGROUND OF THE INVENTION

1. Field of the Invention

The present invention relates to a photodetector apparatus which receives an optical signal having arrived there with a photodiode, so as to detect the intensity of optical signal.

2. Related Background Art

A photodetector apparatus comprises a photodiode and an integrating circuit, in which the photodiode converts inputted optical signals into current signals and outputs thus obtained current signals, and the integrating circuit inputs and integrates the current signals outputted from the photodiode, thereby outputting a voltage signal. According to the integral signal outputted from the integrating circuit, the intensity of optical signal is detected.

The integrating circuit in a conventional photodetector apparatus usually comprises a 2-input/1-output differential amplifier. Namely, the photodiode is connected to the first input terminal of differential amplifier, the second input terminal of differential amplifier is set to a reference potential, and a capacitor and a switch are disposed in parallel between the first input terminal and output terminal of the differential amplifier. In this integrating circuit, the output of differential amplifier is initialized when the switch is closed, and then the switch is opened for a predetermined period of time, so that current signals outputted from the photodiode are stored as an electric charge, whereby the voltage signal corresponding to the electric charge stored in the capacitor is outputted.

Also known are photodetector apparatus (solid-state imaging apparatus) in which photodiodes are arranged one- or two-dimensionally, so as to be able to detect (capture) a spatial intensity distribution of inputted optical signals, i.e., an image (see, for example, Japanese Patent Application Laid-Open No. HEI 9-270961 and 10-4520). Such a photodetector apparatus comprises individual integrating circuits corresponding to respective photodiodes or respective columns of photodiodes, whereas each integrating circuit has a configuration such as the one mentioned above.

SUMMARY OF THE INVENTION

Such a photodetector apparatus is used as a radiation detector in a radiation CT apparatus, for example. In this case, signals outputted from the photodetector apparatus are required to have a very high S/N ratio, and noise is needed to be reduced to the limit. However, the conventional photodetector apparatus have failed to output signals with a sufficient S/N ratio.

In order to overcome the problem mentioned above, it is an object of the present invention to provide a photodetector apparatus which can output signals with an excellent S/N ratio.

This photodetector apparatus comprises a full differential amplifier having two input terminals and two output terminals; a photodiode connected to one of the input terminals; a first capacitor and a first switch which are connected in parallel between one of the input terminals and one of the output terminals; a second capacitor and a second switch which are connected in parallel between the other of the input terminals and the other of the output terminals; and a differential amplifier circuit connected to both of the output terminals.

More preferably, this photodetector apparatus is a photodetector apparatus comprising a photosensitive section which has a photodiode for converting an inputted optical signal into a current signal and outputs the current signal, the photodetector apparatus comprising: (A) an integrating circuit including a first full differential amplifier, having first and second input terminals and first and second output terminals, for feeding the current signal from the photosensitive section into the first input terminal; an additional capacitor, having a capacitance substantially equal to a junction capacitance of the photodiode, connected to the second input terminal of the first full differential amplifier; a first capacitor disposed between the first input terminal and first output terminal of the first full differential amplifier; a first switch disposed in parallel with the first capacitor; a second capacitor disposed between the second input terminal and second output terminal of the first full differential amplifier; and a second switch disposed in parallel with the second capacitor; the integrating circuit inputting and integrating the current signal outputted from the photosensitive section, and outputting integral signals corresponding to a result of integration from the first and second output terminals of the first full differential amplifier, respectively; and (B) a differential amplifier circuit for inputting the respective integral signals outputted from the first and second output terminals of the first full differential amplifier in the integrating circuit and outputting, according to a difference therebetween, a signal corresponding to an intensity of the optical signal.

In the photodetector apparatus, an inputted optical signal is converted into a current signal by the photodiode of the photosensitive section, and this current signal is fed into the first input terminal of the first full differential amplifier in the integrating circuit. If the first and second switches are open, then the inputted current signal is stored as an electric charge in the first capacitor. Since the additional capacitor having a capacitance substantially equal to the junction capacity of the photodiode is connected to the second input terminal of the first full differential amplifier, the first output terminal of the first full differential amplifier outputs an integral signal corresponding to the electric charge stored in the first capacitor, and the second output terminal of the first full differential amplifier outputs an integral signal corresponding to the one obtained when the polarity of the electric charge is reversed. The respective integral signals outputted from the first and second output terminals of the first full differential amplifier are fed into the differential amplifier circuit, and the latter outputs, according to the difference between these signals, a signal corresponding to the intensity of optical signal. The signal outputted from the differential amplifier circuit is only the one corresponding to the magnitude of the current signal outputted from the photosensitive section since noise components cancel each other out, thus yielding an excellent S/N ratio.

In the photodetector apparatus, the integrating circuit may comprise first reference potential setting means for setting each of the first and second output terminals of the first full differential amplifier to a reference potential before an integrating operation. In this case, even though the respective potentials of two output terminals in the first full differential amplifier may be unstable, each of the integral signals outputted from the first full differential amplifier becomes stable.

In the photodetector apparatus, the photosensitive section may have photodiodes arranged in an array of M rows and N columns and sequentially output respective current signals from N photodiodes at timings different from each other in each of M rows; the integrating circuit may be provided for each of M rows of the photosensitive section; and the differential amplifier circuit may sequentially input integral signals outputted from the respective integrating circuits provided for M rows of the photosensitive section and sequentially output respective signals corresponding to the intensities of optical signals inputted to the photodiodes arranged in the array of M rows and N columns. Here, the case where M=N=1 is the case were individual constituents exist one by one. The case where M≧2 and N=1 is the case where M photodiodes are arranged in one-dimensional array in the photosensitive section. The case where M≧2 and N≧2 is the case where M rows and N columns of photodiodes are arranged in a two-dimensional array in the photosensitive section. The differential amplifier circuit sequentially outputs respective signals corresponding to the intensities of optical signals inputted to the M rows and N columns of photodiodes in the photosensitive section.

The photodetector apparatus may further comprise a CDS (correlated double sampling) circuit between the integrating circuit and the differential amplifier circuit. The CDS circuit includes a second full differential amplifier, having first and second input terminals and first and second output terminals, for feeding the integral signals from the first and second output terminals of the integrating circuit into the first and second input terminals; a first capacitor disposed between the first input terminal and first output terminal of the second full differential amplifier; a first switch disposed in parallel with the first capacitor; a second capacitor disposed between the second input terminal and second output terminal of the second full differential amplifier; and a second switch disposed in parallel with the second capacitor; the first and second output terminals of the second full differential amplifier outputting respective fluctuations of the integral signals outputted from the first and second output terminals of the first full differential amplifier in the integrating circuit. Also, the differential amplifier circuit inputs the respective fluctuations of integral signals outputted from the first and second output terminals of the second full differential amplifier in the CDS circuit and outputs, according to a difference therebetween, the signal corresponding to the intensity of optical signal. The signal outputted from the differential amplifier circuit is only the one corresponding to the magnitude of the current signal outputted from the photosensitive section in this case as well since noise components cancel each other out, thus yielding a higher S/N ratio.

In the photodetector apparatus, the CDS circuit may comprise second reference potential setting means for setting each of the first and second output terminals of the second full differential amplifier to a reference potential before an operation for determining the fluctuations of integral signals. In this case, even though the respective potentials of two output terminals of the second full differential amplifiers may be unstable, each of the fluctuations of integral signals outputted from the second full differential amplifier becomes stable.

In the photodetector apparatus, the photosensitive section may have photodiodes arranged in an array of M rows and N columns and sequentially output respective current signals from N photodiodes at timings different from each other in each of M rows; the integrating circuit and CDS circuit may be provided for each of M rows of the photosensitive section; and the differential amplifier circuit may sequentially input respective fluctuations of integral signals outputted from the CDS circuits provided for M rows of the photosensitive section, and output respective signals corresponding to intensities of the optical signals inputted to the photodiodes arranged in the array of M rows and N columns. Here, the case where M=N=1 is the case were individual constituents exist one by one. The case where M≧2 and N=1 is the case where M photodiodes are arranged in one-dimensional array in the photosensitive section. The case where M≧2 and N≧2 is the case where M rows and N columns of photodiodes are arranged in a two-dimensional array in the photosensitive section. The differential amplifier circuit sequentially outputs respective signals corresponding to the intensities of optical signals fed to the M rows and N columns of photodiodes in the photosensitive section.

BRIEF DESCRIPTION OF THE DRAWING

FIGS. 4A, 4B, 4C, 4D, 4E, 4F, 4G, 4H, 4I, 4J, and 4K are timing charts for explaining operations of the photodetector apparatus in accordance with the second embodiment;

DESCRIPTION OF THE PREFFERED EMBODIMENT

In the following, embodiments of the present invention will be explained in detail with reference to the accompanying drawings. In the explanation of drawings, constituents identical to each other will be referred to with numerals or letters identical to each other without repeating their overlapping descriptions.

First, how the present invention is attained will be explained. Since the main part where noise occurs in a conventional photodetector apparatus is considered to be an amplifier in the integrating circuit, the inventor has taken various measures in order to lower the noise resulting from this amplifier. On the other hand, the inventor has found that the part where noise occurs in the conventional photodetector apparatus lies not only in the amplifier but also in wiring routes subsequent to output terminals of the amplifier and in downstream circuits. Namely, the inventor has found that, since the integrating circuit of conventional photodetector apparatus uses a 2-input/1-output differential amplifier, noise is superposed on the voltage signal outputted from the single output terminal of the differential amplifier before the voltage signal reaches downstream circuits by way of wiring routes. The inventor has attained the present invention according to such finding.

First Embodiment

A first embodiment of the photodetector apparatus in accordance with the present invention will now be explained.

Figure 1:
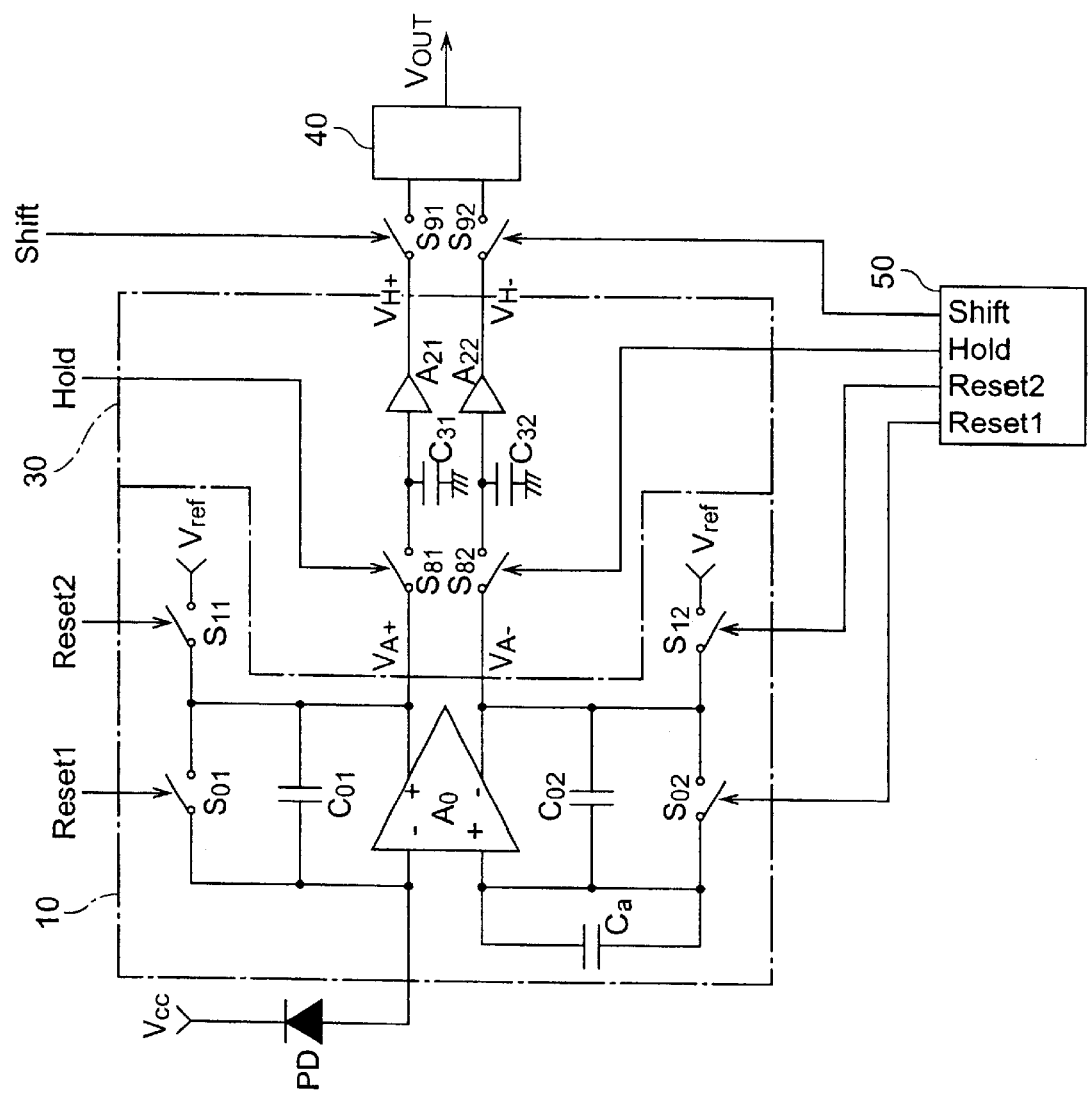
FIG. 1 is a circuit diagram of the photodetector apparatus in accordance with a first embodiment.

FIG. 1 is a circuit diagram of the photodetector apparatus in accordance with the first embodiment. The photodetector apparatus in accordance with this embodiment comprises a photodiode PD, an integrating circuit 10, a holding circuit 30, a differential amplifier circuit 40, and a timing control circuit 50. In this drawing, routes of control signals outputted from the timing control circuit 50 so as to be fed into the integrating circuit 10 and holding circuit 30, respectively, are partly omitted.

The photodiode PD has a cathode terminal connected to a power voltage $V_{cc}$. The integrating circuit 10 for inputting current signals outputted from the anode terminal of the photodiode PD comprises a 2-input/2-output full differential amplifier $A_0$, capacitors $C_{01}$ and $C_{02}$, switches $S_{01}$, $S_{02}$, $S_{11}$, and $S_{12}$, and an additional capacitor $C_a$.

The capacitor $C_{01}$ and switch $S_{01}$ are connected in parallel between the "−" input terminal and "+" output terminal of full differential amplifier $A_0$. The "−" input terminal of full differential amplifier $A_0$ is connected to the anode terminal of photodiode PD. The "+" output terminal of full differential amplifier $A_0$ is connected to a reference potential $V_{ref}$ by way of the switch $S_{11}$.

The capacitor $C_{02}$ and switch $S_{02}$ are connected in parallel between the "+" input terminal and "−" output terminal of full differential amplifier $A_0$. The "+" input terminal of full differential amplifier $A_0$ is connected to the additional capacitor $C_a$. The additional capacitor $C_a$ has a capacitance substantially equal to the junction capacitance of photodiode PD. The "−" output terminal of full differential amplifier $A_0$ is connected to the reference potential $V_{ref}$ by way of the switch $S_{12}$.

Each of the switches $S_{01}$ and $S_{02}$ opens and closes under the control of Reset1 signal outputted from the timing control circuit 50. On the other hand, each of the switches $S_{11}$ and $S_{12}$ opens and closes under the control of Reset2 signal outputted from the timing control circuit 50.

The holding circuit 30 comprises switches $S_{81}$ and $S_{82}$, capacitors $C_{31}$ and $C_{32}$, and buffer amplifiers $A_{21}$ and $A_{22}$. The switch $S_{81}$ is disposed between the "+" output terminal of full differential amplifier $A_0$ and the input terminal of buffer amplifier $A_{21}$. The capacitor $C_{31}$ is disposed between the input terminal of buffer amplifier $A_{21}$ and the ground potential. The switch $S_{82}$ is disposed between the "−" output terminal of full differential amplifier $A_0$ and the input terminal of buffer amplifier $A_{22}$. The capacitor $C_{32}$ is disposed between the input terminal of buffer amplifier $A_{22}$ and the ground potential. Each of the switches $S_{81}$ and $S_{82}$ opens and closes under the control of Hold signal outputted from the timing control circuit 50.

A switch $S_{91}$ is disposed between the output terminal of buffer amplifier $A_{21}$ and one of input terminals of the differential amplifier circuit 40. A switch $S_{92}$ is disposed between the output terminal of buffer amplifier $A_{22}$ and the other input terminal of differential amplifier circuit 40. Each of the switches $S_{91}$ and $S_{92}$ opens and closes under the control of Shift signal outputted from the timing control circuit 50. The differential amplifier circuit 40 calculates and outputs the difference between the respective signals inputted by way of the switches $S_{91}$ and $S_{92}$. The timing control circuit 50 outputs Reset1 signal, Reset2 signal, Hold signal, and Shift signal at their predetermined timings, thereby controlling operations of the photodetector apparatus.

Figure 2:
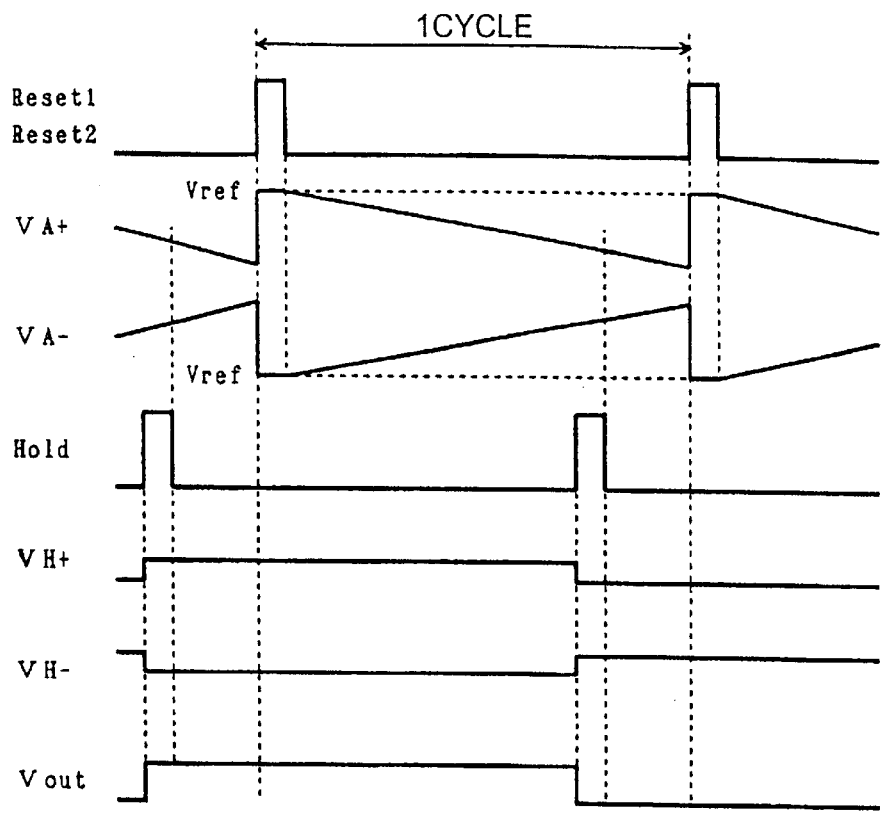
FIGS. 2A, 2B, 2C, 2D, 2E, 2F, and 2G are timing charts for explaining operations of the photodetector apparatus in accordance with the first embodiment.

FIGS. 2A, 2B, 2C, 2D, 2E, 2F, and 2G are timing charts for explaining operations of the photodetector apparatus in accordance with the first embodiment. Reset1 signal and Reset2 signal are pulse signals having a predetermined period, and change at the same timing. The photodetector apparatus in accordance with this embodiment operates while the period from a pulse rising time to the next pulse rising time in each of Reset1 signal and Reset2 signal is defined as one cycle as shown in FIG. 2A, and the other control signals outputted from the timing control circuit 50 are also repeated while this one cycle is taken as their period. In the following, it is assumed that Shift signal outputted from the timing control circuit 50 is always at HIGH level, whereby the switches $S_{91}$ and $S_{92}$ are always closed.

If Reset1 signal and Reset2 signal are at HIGH level, then each of the switches $S_{01}$, $S_{02}$, $S_{11}$, and $S_{12}$ is closed. As a consequence, the "−" input terminal and "+" output terminal of full differential amplifier $A_0$ are short-circuited, whereby the capacitor $C_{01}$ is discharged. Also, the "+" input terminal and "−" output terminal of full differential amplifier $A_0$ are short-circuited, whereby the capacitor $C_{02}$ is discharged. Each of the two output terminals of full differential amplifier $A_0$ is set to the reference potential $V_{ref}$.

If Reset1 signal and Reset2 signal are at LOW level, then each of the switches $S_{01}$, $S_{02}$, $S_{11}$, and $S_{12}$ is opened. As a consequence, the current signal outputted from the photodiode PD is stored as an electric charge in the capacitor $C_{01}$. While the "+" output terminal of full differential amplifier $A_0$ outputs a voltage signal (integral signal) corresponding to the electric charge stored in the capacitor $C_{01}$, the "−" output terminal of full differential amplifier $A_0$ outputs a voltage signal (integral signal) corresponding to the one obtained when the polarity of the electric charge is reversed.

Namely, the voltage signal $V_{A+}$ outputted from the "+" output terminal of full differential amplifier $A_0$ is the reference potential $V_{ref}$ when Reset1 signal and Reset2 signal are at HIGH level, and gradually decreases from the reference potential $V_{ref}$ when Reset1 signal and Reset2 signal are at LOW level (FIG. 2B). On the other hand, the voltage signal $V_{A-}$ outputted from the "−" output terminal of full differential amplifier $A_0$ is the reference potential $V_{ref}$ when Reset1 signal and Reset2 signal are at HIGH level, and gradually increases from the reference potential $V_{ref}$ when Reset1 signal and Reset2 signal are at LOW level (FIG. 2C). The rate at which the voltage signal $V_{A+}$ gradually decreases and the rate at which the voltage signal $V_{A-}$ gradually increases are identical to each other, and correspond to the magnitude of the current signal outputted from the photodiode PD and to the intensity of the optical signal fed into the photodiode PD. Each of the voltage signals $V_{A+}$ and $V_{A-}$ is a signal outputted from the integrating circuit 10.

Hold signal is a pulse signal which attains HIGH level for a predetermined period of time after the lapse of a predetermined time from the pulse falling time of Reset1 signal and Reset2 signal (FIG. 2D). During the period when Hold signal is at HIGH level, each of the switches $S_{81}$ and $S_{82}$ is closed, whereby the capacitor $C_{31}$ is charged with the voltage value of the voltage signal $V_{A+}$ outputted from the "+" output terminal of full differential amplifier $A_0$ at this time, and the capacitor $C_{32}$ is charged with the voltage value of the voltage signal $V_{A-}$ outputted from the "−" output terminal of full differential amplifier $A_0$ at this time. Then, each of the charged voltage value $V_{H+}$ of capacitor $C_{31}$ and the charged voltage value $V_{H-}$ of capacitor $C_{32}$ at the time when Hold signal falls is held thereafter (FIGS. 2E and 2F). Each of the voltage values $V_{H+}$ and $V_{H-}$ is a signal outputted from the holding circuit 30.

The voltage value $V_{H+}$ held in the capacitor $C_{31}$ is fed into the differential amplifier circuit 40 by way of the buffer amplifier $A_{21}$ and switch $S_{91}$, whereas the voltage value $V_{H-}$ held in the capacitor $C_{32}$ is fed into the differential amplifier circuit 40 by way of the buffer amplifier $A_{22}$ and switch $S_{92}$. The differential amplifier circuit 40 subtracts the voltage value $V_{H-}$ from the voltage value $V_{H+}$, and outputs a signal $V_{out}$ as a result thereof (FIG. 2G). This signal $V_{out}$ is a signal outputted from the photodetector apparatus in accordance with this embodiment.

In the photodetector apparatus in accordance with this embodiment, as in the foregoing, the 2-input/2-output full differential amplifier $A_0$ is used in the integrating circuit 10, the photodiode PD is connected to the first input terminal of full differential amplifier $A_0$, and the additional capacitor $C_a$ having a capacitance substantially equal to the junction capacitance of photodiode PD is connected to the second input terminal of full differential amplifier $A_0$. In response to the magnitude of the current signal outputted from the photodiode PD, one of the voltage signals $V_{A+}$ and $V_{A-}$ outputted from the respective output terminals of full differential amplifier $A_0$ gradually increases, whereas the other gradually decreases, with the absolute values of increase and decrease being on a par with each other. Also, noises superposed on the voltage signals $V_{A+}$ and $V_{A-}$ outputted from the respective output terminals of full differential amplifier $A_0$ are on a par with each other. Further, noises superposed on the respective routes from the individual output terminals of full differential amplifier $A_0$ to the differential amplifier circuit 40 are on a par with each other. As a consequence, the noises superposed in the full differential amplifier $A_0$ cancel each other out, and the noises superposed on the routes to the differential amplifier circuit 40 cancel each other out, whereby the signal $V_{out}$ outputted from the differential amplifier circuit 40 is only the signal corresponding to the magnitude of the current signal outputted from the photodiode PD, thus yielding an excellent S/N ratio.

Also, in the photodetector apparatus in accordance with this embodiment, even though the respective output terminals of full differential amplifier $A_0$ may be unstable, the switches $S_{11}$, $S_{12}$ are once closed before an integrating operation in the integrating circuit 10, so that each of the two output terminals of full differential amplifier $A_0$ is set to a reference potential, whereby each of the voltage signals $V_{A+}$, $V_{A-}$ outputted from the full differential amplifier $A_0$ becomes stable.

Figure 3:
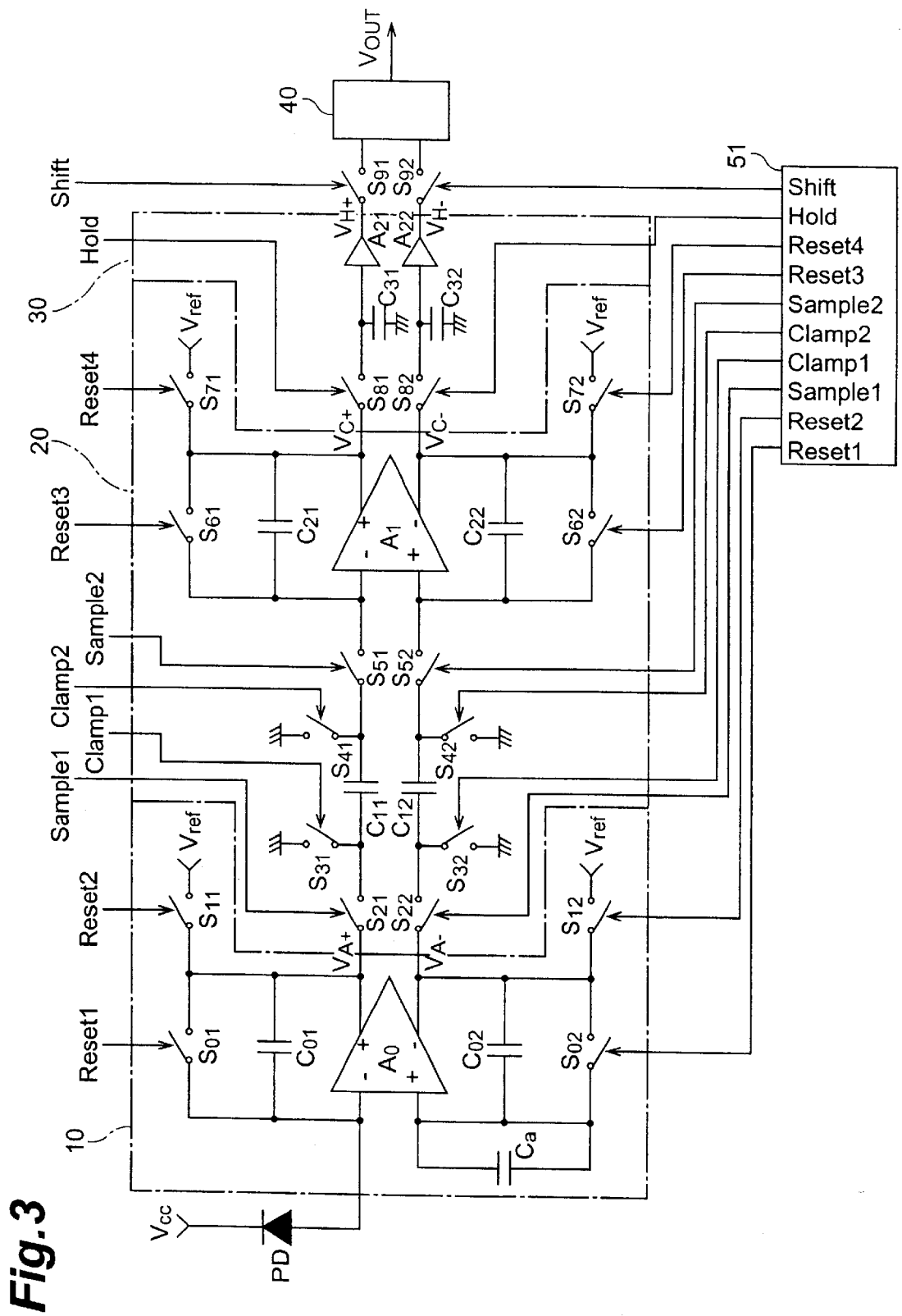
FIG. 3 is a circuit diagram of the photodetector apparatus in accordance with a second embodiment.

Second Embodiment A second embodiment of the photodetector apparatus in accordance with the present invention will now be explained. FIG. 3 is a circuit diagram of the photodetector apparatus in accordance with the second embodiment. The photodetector apparatus in accordance with this embodiment comprises a photodiode PD, an integrating circuit 10, a CDS (correlated double sampling) circuit 20, a holding circuit 30, a differential amplifier circuit 40, and a timing control circuit 51. Routes of control signals outputted from the timing control circuit 51 so as to be fed into the integrating circuit 10, CDS circuit 20, and holding circuit 30, respectively, are partly omitted in this drawing as well.

The photodetector apparatus in accordance with this embodiment differs from that in accordance with the first embodiment in that the CDS circuit 20 is disposed between the integrating circuit 10 and holding circuit 30, and that the timing control circuit 51 is disposed in place of the timing control circuit 50. The integrating circuit 10, holding circuit 30, and differential amplifier circuit 40 are the same as those in the first embodiment, respectively. The CDS circuit 20 comprises a 2-input/2-output full differential amplifier $A_1$, capacitors $C_{11}$, $C_{12}$, $C_{21}$, and $C_{22}$, and switches $S_{21}$, $S_{22}$, $S_{31}$, $S_{32}$, $S_{41}$, $S_{42}$, $S_{51}$, $S_{52}$, $S_{61}$, $S_{62}$, $S_{71}$, and $S_{72}$.

Between the "+" output terminal of full differential amplifier $A_0$ in the integrating circuit 10 and the "−" input terminal of full differential amplifier $A_1$ in the CDS circuit 20, the switch $S_{21}$, capacitor $C_{11}$, and switch $S_{51}$ are cascaded in succession. The switch $S_{31}$ is disposed between the ground potential and the junction between the switch $S_{21}$ and capacitor $C_{11}$. The switch $S_{41}$ is disposed between the ground potential and the junction between the capacitor $C_{11}$ and switch $S_{51}$. The capacitor $C_{21}$ and switch $S_{61}$ are connected in parallel between the "−" input terminal and "+" output terminal of full differential amplifier $A_1$. The "+" output terminal of full differential amplifier $A_1$ is connected to the reference potential $V_{ref}$ by way of the switch $S_{71}$.

Between the "−" output terminal of full differential amplifier $A_0$ in the integrating circuit 10 and the "+" input terminal of full differential amplifier $A_1$ in the CDS circuit 20, the switch $S_{22}$, capacitor $C_{12}$, and switch $S_{52}$ are cascaded in succession. The switch $S_{32}$ is disposed between the ground potential and the junction between the switch $S_{22}$ and capacitor $C_{12}$. The switch $S_{42}$ is disposed between the ground potential and the junction between capacitor $C_{12}$ and the switch $S_{52}$. The capacitor $C_{22}$ and switch $S_{62}$ are connected in parallel between the "+" input terminal and "−" output terminal of full differential amplifier $A_1$. The "−" output terminal of full differential amplifier $A_1$ is connected to the reference potential $V_{ref}$ by way of the switch $S_{72}$.

Each of the switches $S_{21}$ and $S_{22}$ opens and closes under the control of Sample1 signal outputted from the timing control circuit 51. Each of the switches $S_{31}$ and $S_{32}$ opens and closes under the control of Clamp1 signal outputted from the timing control circuit 51. Each of the switches $S_{41}$ and $S_{42}$ opens and closes under the control of Clamp2 signal outputted from the timing control circuit 51. Each of the switches $S_{51}$ and $S_{52}$ opens and closes under the control of Sample2 signal outputted from the timing control circuit 51. Each of the switches $S_{61}$ and $S_{62}$ opens and closes under the control of Reset3 signal outputted from the timing control circuit 51. Each of the switches $S_{71}$ and $S_{72}$ opens and closes under the control of Reset4 signal outputted from the timing control circuit 51.

The timing control circuit 51 outputs Reset1 signal, Reset2 signal, Sample1 signal, Clamp1 signal, Clamp2 signal, Sample2 signal, Reset3 signal, Reset4 signal, Hold signal, and Shift signal at their predetermined timings, thereby controlling operations of the photodetector apparatus.

FIGS. 4A, 4B, 4C, 4D, 4E, 4F, 4G, 4H, 4I, 4J, and 4K are timing charts for explaining operations of the photodetector apparatus in accordance with the second embodiment. Reset1 signal and Reset2 signal are pulse signals having a predetermined period, and change at the same timing. The photodetector apparatus in accordance with this embodiment operates while the period from a pulse rising time to the next pulse rising time in each of Reset1 signal and Reset2 signal is defined as one cycle as shown in FIG. 4A, and the other control signals outputted from the timing control circuit 51 are also repeated while this one cycle is taken as their period. In the following, it is assumed that Shift signal outputted from the timing control circuit 51 is always at HIGH level, whereby the switches $S_{91}$, and $S_{92}$ are always closed.

If Reset1 signal and Reset2 signal are at HIGH level, then each of the switches $S_{01}$, $S_{02}$, $S_{11}$, and $S_{12}$ is closed. As a consequence, the "−" input terminal and "+" output terminal of full differential amplifier $A_0$ are short-circuited, whereby the capacitor $C_{01}$ is discharged. Also, the "+" input terminal and "−" output terminal of full differential amplifier $A_0$ are short-circuited, whereby the capacitor $C_{02}$ is discharged. Each of the two output terminals of full differential amplifier $A_0$ is set to the reference potential $V_{ref}$.

Clamp1 signal and Clamp2 signal are pulse signals changing at the same timing as with Reset1 signal and Reset2 signal (FIG. 4A). If Clamp1 signal and Clamp2 signal are at HIGH level, then each of the switches $S_{31}$, $S_{32}$, $S_{41}$, and $S_{42}$ is closed, whereby the capacitors $C_{11}$ and $C_{12}$ are discharged.

Reset3 signal and Reset4 signal are pulse signals rising at the same timing as with Reset1 signal and Reset2 signal and falling after the lapse of a predetermined time from the pulse falling time of Reset1 signal and Reset2 signal (FIG. 4B). If Reset3 signal and Reset4 signal are at HIGH level, then each of the switches $S_{61}$, $S_{62}$, $S_{71}$, and $S_{72}$ is closed. As a consequence, the "−" input terminal and "+" output terminal of full differential amplifier $A_1$ are short-circuited, whereby the capacitor $C_{21}$ is discharged. Also, the "+" input terminal and "−" output terminal of full differential amplifier $A_1$ are short-circuited, whereby the capacitor $C_{22}$ is discharged. Each of the two output terminals of full differential amplifier $A_1$ is set to the reference potential $V_{ref}$.

Sample1 signal and Sample2 signal are pulse signals obtained when Reset3 signal and Reset4 signal are reversed (FIG. 4C). Namely, if Reset3 signal and Reset4 signal are at HIGH level, then Sample1 signal and Sample2 signal are at LOW level, whereby each of the switches $S_{21}$, $S_{22}$, $S_{51}$, and $S_{52}$ is opened.

If Reset1 signal and Reset2 signal are at LOW level, then each of the switches $S_{01}$, $S_{02}$, $S_{11}$, and $S_{12}$ is opened. As a consequence, the current signal outputted from the photodiode PD is stored as an electric charge in the capacitor $C_{01}$. While the "+" output terminal of full differential amplifier $A_0$ outputs a voltage signal (integral signal) corresponding to the electric charge stored in the capacitor $C_{01}$, the "−" output terminal of full differential amplifier $A_0$ outputs a voltage signal (integral signal) corresponding to the one obtained when the polarity of the electric charge is reversed.

Namely, the voltage signal $V_{A+}$ outputted from the "+" output terminal of full differential amplifier $A_0$ is the reference potential $V_{ref}$ when Reset1 signal and Reset2 signal are at HIGH level, and gradually decreases from the reference potential $V_{ref}$ when Reset1 signal and Reset2 signal are at LOW level (FIG. 4D). On the other hand, the voltage signal $V_{A-}$ outputted from the "−" output terminal of full differential amplifier $A_0$ is the reference potential $V_{ref}$ when Reset1 signal and Reset2 signal are at HIGH level, and gradually increases from the reference potential $V_{ref}$ when Reset1 signal and Reset2 signal are at LOW level (FIG. 4E). The rate at which the voltage signal $V_{A+}$ gradually decreases and the rate at which the voltage signal $V_{A-}$ gradually increases are identical to each other, and correspond to the magnitude of the current signal outputted from the photodiode PD and to the intensity of the optical signal fed into the photodiode PD. Each of the voltage signals $V_{A+}$ and $V_{A-}$ is a signal outputted from the integrating circuit 10.

At the same time when Reset1 signal and Reset2 signal attain LOW level, Clamp1 signal and Clamp2 signal attain LOW level, whereby each of the switches $S_{31}$, $S_{32}$, $S_{41}$, and $S_{42}$ is opened. After the lapse of a predetermined period of time from the falling time of Reset1 signal and Reset2 signal, Reset3 signal and Reset4 signal attain LOW level, whereby each of the switches $S_{61}$, $S_{62}$, $S_{71}$, and $S_{72}$ is opened, whereas Sample1 signal and Sample2 signal attain HIGH level, whereby each of the switches $S_{21}$, $S_{22}$, $S_{51}$, and $S_{52}$ is closed.

From this point in time, the voltage signals $V_{A+}$, $V_{A-}$ outputted from the two output terminals of full differential amplifier $A_0$ in the integrating circuit 10 are fed into the input terminals of full differential amplifier $A_1$ by way of the capacitors $C_{11}$, $C_{12}$ of CDS circuit 20, respectively. Namely, as $V_{C+}$, $V_{C-}$ from the two output terminals of full differential amplifier $A_1$, the CDS circuit 20 outputs the fluctuations of the voltage signals $V_{A+}$, $V_{A-}$ outputted from the two output terminals of full differential amplifier $A_0$ in the integrating circuit 10, respectively (FIGS. 4F and 4G).

Hold signal is a pulse signal which attains HIGH level for a predetermined period of time after the lapse of a predetermined time from the pulse rising time of Sample1 signal and Sample2 signal (FIG. 4H). During the period when Hold signal is at HIGH level, each of the switches $S_{81}$ and $S_{82}$ is closed, whereby the capacitor $C_{31}$ is charged with the voltage value of the voltage signal $V_{C+}$ outputted from the "+" output terminal of full differential amplifier $A_1$ at this time, and the capacitor $C_{32}$ is charged with the voltage value of the voltage signal $V_{C-}$ outputted from the "−" output terminal of full differential amplifier $A_1$ at this time. Then, each of the charged voltage value $V_{H+}$ of capacitor $C_{31}$ and the charged voltage value $V_{H-}$ of capacitor $C_{32}$ at the time when Hold signal falls is held thereafter (FIGS. 4I and 4J). Each of the voltage values $V_{H+}$ and $V_{H-}$ is a signal outputted from the holding circuit 30.

The voltage value $V_{H+}$ held in the capacitor $C_{31}$ is fed into the differential amplifier circuit 40 by way of the buffer amplifier $A_{21}$ and switch $S_{91}$, whereas the voltage value $V_{H-}$ held in the capacitor $C_{32}$ is fed into the differential amplifier circuit 40 by way of the buffer amplifier $A_{22}$ and switch $S_{92}$. The differential amplifier circuit 40 subtracts the voltage value $V_{H-}$ from the voltage value $V_{H+}$, and outputs a signal $V_{out}$ as a result thereof (FIG. 4K). This signal $V_{out}$ is a signal outputted from the photodetector apparatus in accordance with this embodiment.

In addition to the effect achieved by the photodetector apparatus in accordance with the first embodiment, the photodetector apparatus in accordance with the second embodiment is effective in the following. The 2-input/2-output full differential amplifier $A_1$ is used in the CDS circuit 20, whereas the output terminals of full differential amplifier $A_0$ in the integrating circuit 10 are connected to the input terminals of full differential amplifier $A_1$ by way of the capacitors $C_{11}$, $C_{12}$, respectively. In response to the fluctuations of the voltage signals $V_{A+}$ and $V_{A-}$ outputted from the respective output terminals of full differential amplifier $A_0$ in the integrating circuit 10, one of the voltage signals $V_{C+}$ and $V_{C-}$ outputted from the respective output terminals of full differential amplifier $A_1$ in the CDS circuit 20 gradually increases, whereas the other gradually decreases, with the absolute values of increase and decrease being on a par with each other. Also, noises superposed on the voltage signals $V_{C+}$ and $V_{C-}$ outputted from the respective output terminals of full differential amplifier $A_1$ are on a par with each other. Further, noises superposed on the respective routes from the individual output terminals of full differential amplifier $A_1$ to the differential amplifier circuit 40 are on a par with each other. As a consequence, the noises superposed in the full differential amplifier $A_1$ cancel each other out, and the noises superposed on the routes to the differential amplifier circuit 40 cancel each other out, whereby the signal $V_{out}$ outputted from the differential amplifier circuit 40 is only the signal corresponding to the magnitude of the current signal outputted from the photodiode PD, thus yielding an excellent S/N ratio.

Also, in the photodetector apparatus in accordance with this embodiment, even though the respective output terminals of full differential amplifier $A_1$ may be unstable, the switches $S_{71}$, $S_{72}$ are once closed before an operation in the CDS circuit 20, so that each of the two output terminals of full differential amplifier $A_1$ is set to a reference potential, whereby each of the voltage signals $V_{C+}$, $V_{C-}$ outputted from the full differential amplifier $A_1$ becomes stable.

Third Embodiment

Figure 5:
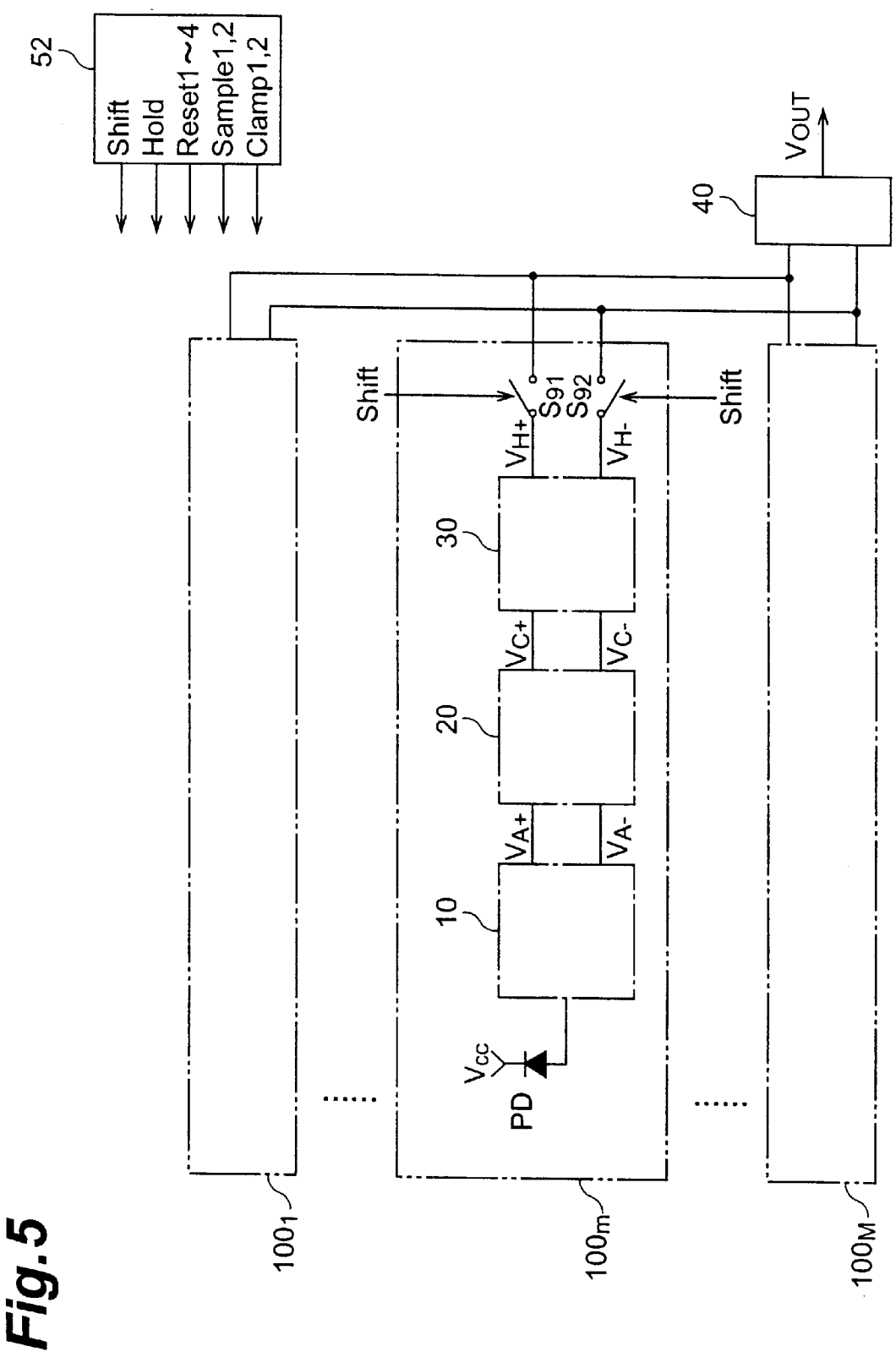
FIG. 5 is a circuit diagram of the photodetector apparatus in accordance with a third embodiment.

A third embodiment of the photodetector apparatus in accordance with the present invention will now be explained. FIG. 5 is a circuit diagram of the photodetector apparatus in accordance with the third embodiment. The photodetector in accordance with this embodiment has a photosensitive section in which M photodiodes PD are arranged in a one-dimensional array. Individual units $100_1$ to $100_M$ shown in this drawing have configurations identical to each other, each comprising the photodiode PD, integrating circuit 10, CDS circuit 20, holding circuit 30, and switches $S_{91}$ and $S_{92}$ similar to those explained in the second embodiment. The two outputs of each of the units $100_1$ to $100_M$ are connected to the differential amplifier circuit 40 in common. Routes of control signals outputted from a timing control circuit 52 so as to be fed into the units $100_1$ to $100_M$, respectively, are omitted in this drawing as well.

The timing control circuit 52 is substantially the same as the timing control circuit 51 explained in the second embodiment, and outputs Reset1 signal and Reset2 signal to the respective integrating circuits 10 of M units $100_1$ to $100_M$ at the same time, Reset3 signal, Reset4 signal, Sample1 signal, Sample2 signal, Clamp1 signal, and Clamp2 signal to the respective CDS circuits 20 of M units $100_1$ to $100_M$ at the same time, and Hold signal to the respective holding circuits 30 of M units $100_1$ to $100_M$ at the same time.

Here, to the individual switches $S_{91}$ and $S_{92}$ of M units $100_1$ to $100_M$, the timing control circuit 52 outputs Shift signals which successively attain HIGH level at timings different from each other during the period from a falling time of Hold signal to the next rising time thereof.

Therefore, among the M units $100_1$ to $100_M$, the integrating circuits 10 operate at the same timing, the CDS circuits 20 operate at the same timing, and the holding circuits 30 operate at the same timing. These operations are similar to those explained in the second embodiment (FIGS. 4A to 4J).

During the period from the falling time of Hold signal to the next rising time thereof, the individual switches $S_{91}$ and $S_{92}$ of M units $100_1$ to $100_M$ successively close according to the instructions of Shift signals, whereby the voltage signals $V_{H+}$, $V_{H-}$ outputted from the respective holding circuits 30 of units are successively fed into the differential amplifier circuit 40. The differential amplifier circuit 40 subtracts the voltage signals $V_{H-}$ from the voltage signals $V_{H+}$, and outputs signals $V_{out}$ as results thereof. Namely, the photodetector apparatus sequentially outputs values corresponding to the intensities of optical signals fed into the photodiodes PD of M units $100_1$, to $100_M$, respectively, within the period of one cycle.

The photodetector apparatus in accordance with this embodiment exhibits effects similar to those of the photodetector apparatus in accordance with the second embodiment. In particular, even though the individual switches $S_{91}$ and $S_{92}$ of M units $100_1$ to $100_M$ may be opened and closed by Shift signals, whereby noises may be superposed on the signals reaching the differential amplifier circuit 40, these noises cancel each other out, so that each signal $V_{out}$ outputted from the differential amplifier circuit 40 becomes only the one corresponding to the magnitude of the current signal outputted from the respective photodiode PD, thus yielding an excellent S/N ratio.

Fourth Embodiment

Figure 6:
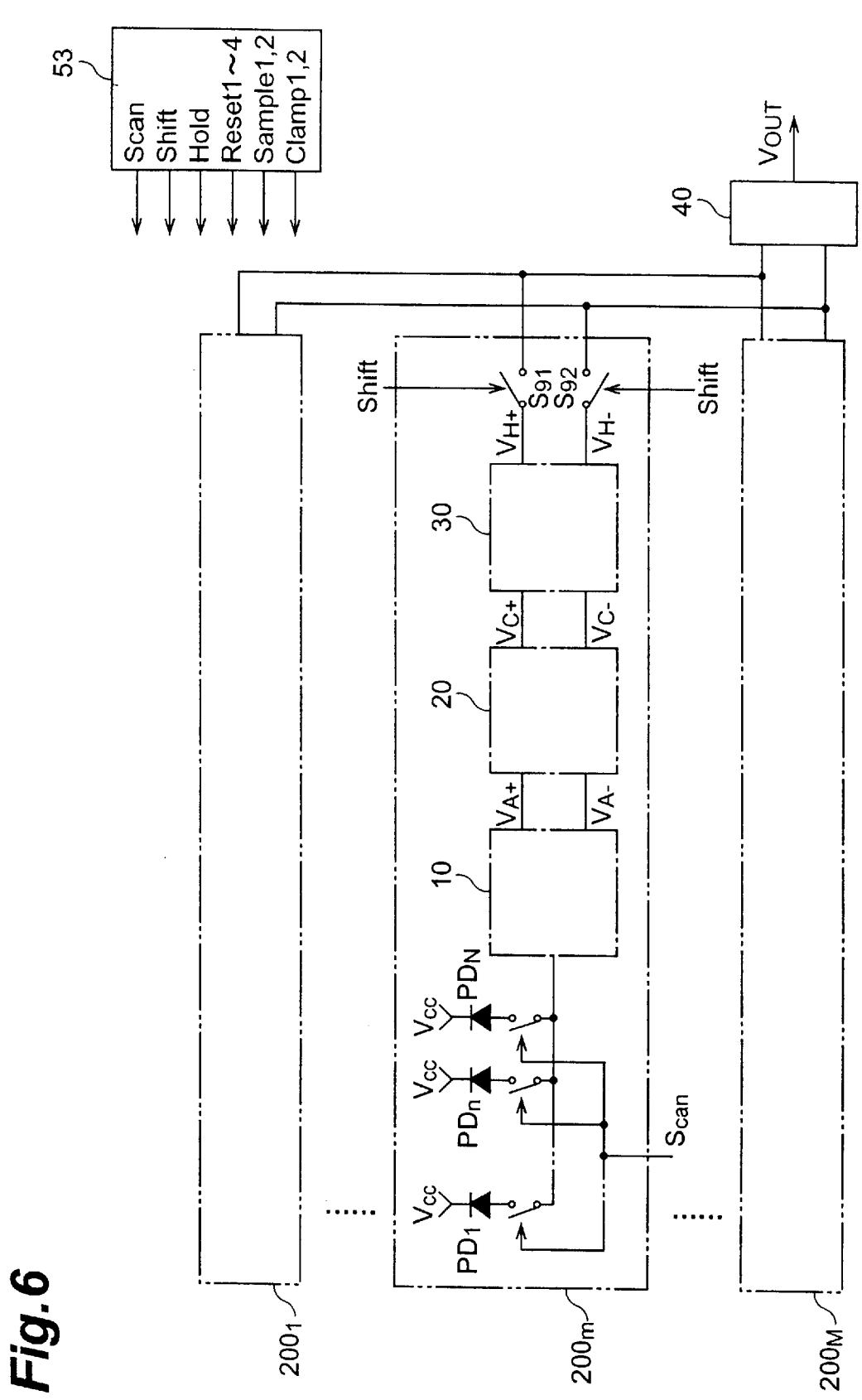
FIG. 6 is a circuit diagram of the photodetector apparatus in accordance with a fourth embodiment.

A fourth embodiment of the photodetector apparatus in accordance with the present invention will now be explained. FIG. 6 is a circuit diagram of the photodetector apparatus in accordance with the fourth embodiment. The photodetector in accordance with this embodiment has a photosensitive section in which M rows and N columns of photodiodes PD are arranged in a two-dimensional array. Individual units $200_1$ to $200_M$ shown in this drawing have configurations identical to each other, each comprising N photodiodes $PD_1$ to $PD_N$, and the integrating circuit 10, CDS circuit 20, holding circuit 30, and switches $S_{91}$ and $S_{92}$ similar to those explained in the second embodiment. The two outputs of each of the units $200_1$, to $200_M$ are connected to the differential amplifier circuit 40 in common. Routes of control signals outputted from a timing control circuit 53 so as to be fed into the units $200_1$ to $200_M$, respectively, are omitted in this drawing as well.

In each of the units $200_1$ to $200_M$, the respective anode terminals of N photodiodes are connected to the "+" input terminalof full differential amplifier $A_0$ in the integrating circuit 10 by way of switches.

The timing control circuit 53 is substantially the same as the timing control circuit 51 explained in the second embodiment, and outputs Reset1 signal and Reset2 signal to the respective integrating circuits 10 of M units $200_1$ to $200_M$ at the same time, Reset3 signal, Reset4 signal, Sample1 signal, Sample2 signal, Clamp1 signal, and Clamp2 signal to the respective CDS circuits 20 of M units $200_1$ to $200_M$ at the same time, and Hold signal to the respective holding circuits 30 of M units $200_1$ to $200_M$ at the same time.

Here, to the individual switches $S_{91}$ and $S_{92}$ of M units $200_1$ to $200_M$, the timing control circuit 53 outputs Shift signals which successively attain HIGH level at timings different from each other during the period from a falling time of Hold signal to the next rising time thereof. Also, the timing control circuit 53 outputs Scan signal for sequentially closing the respective switches corresponding to the N photodiodes $PD_1$ to $PD_N$ in each of the units $200_1$ to $200_M$ per cycle.

Therefore, among the M units $200_1$ to $200_M$, the integrating circuits 10 operate at the same timing, the CDS circuits 20 operate at the same timing, and the holding circuits 30 operate at the same timing. These operations are similar to those explained in the second embodiment (FIGS. 4A to 4J).

During the period from the falling time of Hold signal to the next rising time thereof, the individual switches $S_{91}$ and $S_{92}$ of M units $200_1$ to $200_M$ successively close according to the instructions of Shift signals, whereby the voltage signals $V_{H+}$, $V_{H-}$ outputted from the respective holding circuits 30 of units are successively fed into the differential amplifier circuit 40. The differential amplifier circuit 40 subtracts the voltage signals $V_{H-}$ from the voltage signals $V_{H+}$, and outputs signals $V_{out}$ as results thereof. Namely, the photodetector apparatus sequentially outputs values corresponding to the intensities of optical signals fed into the n-th photodiodes $PD_n$ selected by Scan signal in the M units $200_1$ to $200_M$, respectively, within the period of one cycle. In the next cycle, the photodetector apparatus sequentially outputs values corresponding to the intensities of optical signals fed into the (n+1)-th photodiodes $PD_{n+1}$ selected by Scan signal in the M units $200_1$ to $200_M$, respectively.

The photodetector apparatus in accordance with this embodiment exhibits effects similar to those of the photodetector apparatus in accordance with the third embodiment.

Without being restricted to the above-mentioned embodiments, the present invention can be modified in various manners. For example, while each of the units $100_1$ to $100_M$ in the third embodiment or each of the units $200_1$ to $200_M$ in the fourth embodiment includes the CDS circuit 20 as in the second embodiment, it may be free of the CDS circuit as in the first embodiment.

Figure 7:
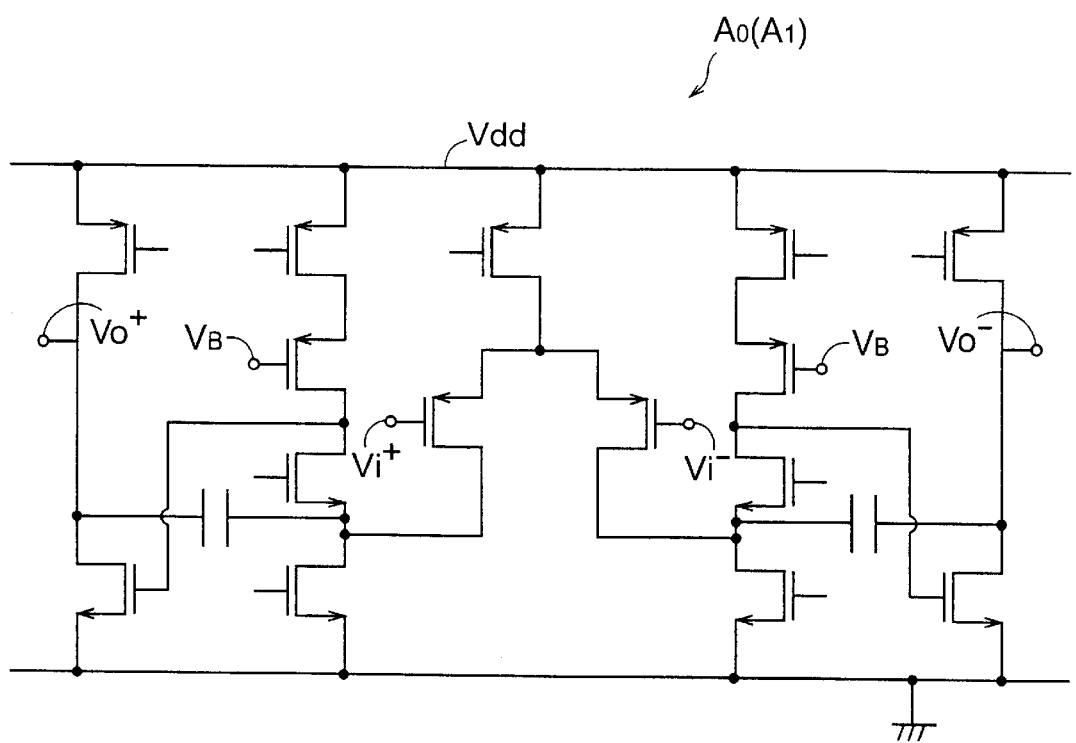
FIG. 7 is a circuit diagram of a full differential amplifier.

A 2-input/2-output differential amplifier is disclosed in IEEE JOURNAL OF SOLID STATE CIRCUITS, Vol. 34, No. 5, pp. 599–606, for example, whereas an example of 2-input/2-output differential amplifier $A_0$ ($A_1$) is shown in FIG. 7. In this drawing, input terminals are referred to as $V_i^+$ and $V_i^-$, whereas output terminals are referred to as $V_o^+$ and $V_o^-$. Between the power line $V_{dd}$ and the ground, P-type MOSFETs, N-type MOSFETs, and capacitors are connected as depicted.

In this apparatus, as explained in detail in the foregoing, a 2-input/2-output differential amplifier is employed in the integrating circuit, a photodiode is connected to one input terminal, and an additional capacitor having a capacitance substantially equal to the junction capacitance of the photodiode is connected to the other input terminal, whereas a 2-input/2-output differential amplifier is also employed in a CDS circuit if the latter is included therein, so that the noises superposed in the full differential amplifier cancel each other out, and the noises superposed on the routes to the differential amplifier circuit cancel each other out, whereby the signal outputted from the differential amplifier circuit, i.e., the signal outputted from the photodetector apparatus, becomes only the signal corresponding to the magnitude of the current signal outputted from the photodiode, thus yielding an excellent S/N ratio. Therefore, the apparatus can favorably be used as a radiation detector in a radiation CT apparatus in which noise is needed to be reduced to the limit.

In the case where each of the two output terminals of a full differential amplifier is set to a reference potential before each operation, even though the respective potentials of two output terminals in the first full differential amplifier may be unstable, each of the fluctuations in integral signals outputted from the full differential amplifier becomes stable.

What is claimed is:

1. A photodetector apparatus comprising a photosensitive section which has a photodiode for converting an inputted optical signal into a current signal and outputs said current signal, said photodetector apparatus comprising:

(A) an integrating circuit including a first full differential amplifier, having first and second input terminals and first and second output terminals, for feeding said current signal from said photosensitive section into said first input terminal; an additional capacitor, having a capacitance substantially equal to a junction capacitance of said photodiode, connected to said second input terminal of said first full differential amplifier; a first capacitor disposed between said first input terminal and first output terminal of said first full differential amplifier; a first switch disposed in parallel with said first capacitor; a second capacitor disposed between said second input terminal and second output terminal of said first full differential amplifier; and a second switch disposed in parallel with said second capacitor; said integrating circuit inputting and integrating said current signal outputted from said photosensitive section, and outputting integral signals corresponding to a result of integration from said first and second output terminals of said first full differential amplifier, respectively; and (B) a differential amplifier circuit for inputting said respective integral signals outputted from said first and second output terminals of said first full differential amplifier in said integrating circuit and outputting, according to a difference therebetween, a signal corresponding to an intensity of said optical signal.

2. A photodetector apparatus according to claim 1, wherein said integrating circuit comprises first reference potential setting means for setting each of said first and second output terminals of said first full differential amplifier to a reference potential before an integrating operation.

3. A photodetector apparatus according to claim 1, wherein said photosensitive section has photodiodes arranged in an array of M rows and N columns and sequentially outputs respective current signals from N photodiodes at timings different from each other in each of M rows;

wherein said integrating circuit is provided for each of M rows of said photosensitive section; and wherein said differential amplifier circuit sequentially inputs integral signals outputted from said integrating circuits respectively provided for M rows of said photosensitive section and sequentially outputs respective signals corresponding to intensities of said optical signals inputted to the photodiodes arranged in the array of M rows and N columns.

4. A photodetector apparatus according to claim 1, further comprising a CDS circuit disposed between said integrating circuit and said differential amplifier circuit; said CDS circuit including a second full differential amplifier, having first and second input terminals and first and second output terminals, for feeding said integral signals from said first and second output terminals of said integrating circuit into said first and second input terminals; a first capacitor disposed between said first input terminal and first output terminal of said second full differential amplifier; a first switch disposed in parallel with said first capacitor; a second capacitor disposed between said second input terminal and second output terminal of said second full differential amplifier; and a second switch disposed in parallel with said second capacitor; said first and second output terminals of said second full differential amplifier outputting respective fluctuations of said integral signals outputted from said first and second output terminals of said first full differential amplifier in said integrating circuit;

wherein said differential amplifier circuit inputs said respective fluctuations of integral signals outputted from said first and second output terminals of said second full differential amplifier in said CDS circuit and outputs, according to a difference therebetween, the signal corresponding to the intensity of said optical signal.

5. A photodetector apparatus according to claim 4, wherein said CDS circuit comprises second reference potential setting means for setting each of said first and second output terminals of said second full differential amplifier to a reference potential before an operation for determining said fluctuations of integral signals.

6. A photodetector apparatus according to claim 4, wherein said photosensitive section has photodiodes arranged in an array of M rows and N columns and sequentially outputs respective current signals from N photodiodes at timings different from each other in each of M rows;

wherein said integrating circuit and CDS circuit are provided for each of M rows of said photosensitive section; and wherein said differential amplifier circuit sequentially inputs respective fluctuations of integral signals outputted from said CDS circuits provided for M rows of said photosensitive section, and outputs respective signals corresponding to intensities of said optical signals inputted to the photodiodes arranged in the array of M rows and N columns.

7. A photodetector apparatus comprising a full differential amplifier having two input terminals and two output terminals, a photodiode connected to one of said input terminals, a first capacitor and a first switch which are connected in parallel between one of said input terminals and one of said output terminals, a second capacitor and a second switch which are connected in parallel between the other of said input terminals and the other of said output terminals, and a differential amplifier circuit connected to both of said output terminals, said other input terminal of said full differential amplifier being connected to a reference potential, said first and second switches opening and closing such that an output of said differential amplifier circuit becomes a signal corresponding to a magnitude of a current signal outputted from said photodiode.

* * * * *